United States Patent [19]

Kawamata

[11] 4,433,468
[45] Feb. 28, 1984

[54] METHOD FOR MAKING SEMICONDUCTOR DEVICE HAVNG IMPROVED THERMAL STRESS CHARACTERISTICS

[75] Inventor: Ikuo Kawamata, Tokyo, Japan

[73] Assignee: Nippon Electric Co., Ltd., Tokyo, Japan

[21] Appl. No.: 245,982

[22] Filed: Mar. 20, 1981

[30] Foreign Application Priority Data

Mar. 26, 1980 [JP] Japan .................................. 55-38368

[51] Int. Cl.³ .................. H01L 21/22; H01L 21/265; H01L 21/28
[52] U.S. Cl. .................................... 29/571; 29/576 B; 29/591; 148/187; 148/188
[58] Field of Search ................... 148/187, 188; 29/571, 29/591, 576 B

[56] References Cited

U.S. PATENT DOCUMENTS

| | | | |
|---|---|---|---|
| 3,382,568 | 5/1968 | Kuiper | 29/578 |
| 3,918,149 | 11/1975 | Roberts | 29/591 X |
| 4,041,518 | 8/1977 | Shimizu et al. | 148/188 X |
| 4,084,311 | 4/1978 | Yasuoka et al. | 29/571 |
| 4,151,631 | 5/1979 | Klein | 148/188 X |
| 4,313,768 | 2/1982 | Sanders et al. | 148/187 X |

*Primary Examiner*—G. Ozaki
*Attorney, Agent, or Firm*—Laff, Whitesel, Conte & Saret

[57] ABSTRACT

A semiconductor device has a first semiconductor layer with a main surface and a second semiconductor layer forming a PN junction with the first semiconductor layer, the PN junction reaching the main surface. An insulating layer is formed on the main surface and has at least one window which at least exposes a part of the second semiconductor layer. A third semiconductor layer, which is the same conductivity type as the second semiconductor layer, is formed on a portion exposed in the window. A metal-semiconductor alloy layer is electrically connected to the third semiconductor layer. According to another aspect of the invention, a method of manufacturing the smiconductor device uses the steps of providing a first semiconductor layer with a main surface, making a second semiconductor layer to form a PN junction reaching the main surface of the first semiconductor layer, and forming an insulating layer with at least one window exposing at least a part of the second semiconductor layer on the main surface. A third semiconductor layer is formed in the exposed window by introducing impurities of the same conductivity type as that used in the second semiconductor layer, through the window, thus forming a non-doped semiconductor layer which covers the third semiconductor layer. A metal layer is formed on the non-doped semiconductor layer.

13 Claims, 24 Drawing Figures

METHOD FOR MAKING SEMICONDUCTOR DEVICE HAVNG IMPROVED THERMAL STRESS CHARACTERISTICS

BACKGROUND OF THE INVENTION

The present invention relates to a semiconductor device and to a method of manufacturing the device. More particularly, it relates to a structure having an electrical connection to a semiconductor region having a shallow PN junction of, especially, a complementary MOS semiconductor device.

A shallow PN junction greatly contributes to the improvement in performances of semiconductor devices. For example, a bipolar transistor, of the type in which the base and emitter regions constitute a shallow PN junction, improves high frequency characteristics and current amplification factors. An insulated gate field effect transistor, in which the source and drain regions form shallow PN junctions, has an improved increase of its mutual conductance and increment of integration degree of circuit elements.

However, it is well known that when a metal electrode (wiring), especially, of aluminum, is provided to make an ohmic contact with a semiconductor region forming the shallow PN junction, the PN junction is easily destroyed by the metal electrode (wiring) with a resulting of short circuit between two semiconductor regions forming the PN junction. Specifically, in the manufacturing step of the metal electrode, the aluminum is deposited on the semiconductor region. Then a heat treatment (at a temperature from 400° C. to 500° C.) is performed in order to ensure the mutual electrical condition. By this heat treatment, aluminum diffuses into the semiconductor region while semiconductor material diffuses into the aluminum. As the result of this mutual diffusion, an alloy material of the semiconductor material and aluminum is formed to enhance the electrical connection of the semiconductor region and the aluminum wiring. This alloy material grows toward the PN junction, from the contact portion between the semiconductor region and the metal wire. The growth of the alloy material advances as a function of the heat treatment time. When the PN junction is relatively deep, the alloy material does not reach the PN junction and does not destroy it. However, when the PN junction is very shallow, for example, 0.5μ, the alloy reaction of the semiconductor region and the metal wire advances near the PN junction to increase a leakage current at the PN junction, and finally reaches the PN junction to destroy it. This destruction alloy is the so-called "alloy spike".

The conventional methods have been used for providing the electrode contact to the shallow PN junction, and for overcoming the above-mentioned disadvantages. When the semiconductor material is silicon, these methods are as follows:

(i) An aluminum layer containing silicon in an amount above its solid solubility limitation at a room temperature is deposited on an impurity region of a silicon substrate. Thus, the reaction of aluminum with silicon is carried out so as not to reach the PN junction, as disclosed in U.S. Pat. No. 3,382,568 issued on May 14, 1968 and granted to L. L. Kuiper.

(ii) An additional silicon layer is layered between the impurity region and the aluminum layer, and silicon diffused into the aluminum layer is not supplied from the impurity region but is supplied from the additional silicon layer, as is also disclosed in the above cited Kuiper reference;

(iii) A polycrystalline silicon layer, doped with an impurity, is deposited on a monocrystalline silicon substrate. Then, the impurity is diffused into the monocrystalline silicon substrate to form the impurity region having a shallow PN junction. The aluminum wiring layer is deposited on poly-crystalline silicon layer to be electrically connected to the impurity region.

By the above methods, the aluminum wiring layer has been formed for the semiconductor region having the shallow PN junction.

The formation of wiring (electrode) connected to the semiconductor region is generally performed in such a manner that, wiring material is deposited on a semiconductor region through a contact window. The contact window is formed after an insulating layer for protecting the surface of the semiconductor body and the PN junction reaching the surface is etched away at its predetermined location. The formation of the contact window in the insulating layer is performed by a photoetching technique, which is well known. In addition, the semiconductor region is also formed by using a diffusing mask having a window at its predetermined location, which mask is formed by the photoetching technique.

Ideally, it is preferred that those contact windows should be precisely formed at desired locations and with desired size. However, because the misalignment of mask patterns for forming the contact window is unavoidable, the contact window and the window through which diffussion occurs are formed in practice at locations and in sizes which take into account the misalignment of the mask pattern. Consequently, the diffused region and contact windows which are actually formed become larger than ideal. Furthermore, by taking account of the possible misalignment of the mark pattern, the distance between the adjacent regions or elements is elongated. These problems are inherent to the photoetching method, and due to these problem, the increase of an integration density of circuit elements is impossible.

The above conventional methods have succeeded in an attempt to avoid the breakdown of the shallow PN junction by the alloy spike, but have failed to increase the integration density due to the above problems in the photoetching method. More particularly, in the above methods (i) and (ii), the factor of the mask misalignment is already considered in the course of design, so that the contact window for the electrode connection is located on only one conductivity type semiconductor region. However, in such a design, if the misalignment of the mask pattern is neglected to increase the integration density is the contact window often exposes the PN junction. As a result of such a junction exposure, in forming the aluminum layer containing silicon or in successively forming the silicon layer and the aluminum layer, a shortcircuiting of the PN junction would occur irrespective of the alloy spike.

The method (iii) is that the semiconductor region is formed by the impurity diffusion from the poly-crystalline silicon layer containing the impurity. The aluminum interconnecting layer is deposited on the doped poly-crystalline silicon layer. Accordingly, on the polycrystalline silicon layer is formed on a semiconductor region and both are of the same conductivity type. Therefore, there is neither the breakdown of the PN junction by the alloy spike nor the shortcircuiting by the interconnecting material. However, the formation of the semiconductor region by the impurity diffusion from the doped poly-crystalline silicon layer is not compatible with the mass production of semiconductor devices. This is because the method has such a disadvantage that the impurity profile and the junction depth cannot be precisely controlled.

Furthermore, the aluminum layer makes direct contact with the polycrystalline silicon layer containing the impurity. In this case, completely different kinds of two materials are in contact, and therefore the contact intimacy between them is poor. Even if the heat treatment is performed, a reaction between them hardly takes place. This is because a sufficient amount of the impurity is already doped in the poly-crystalline silicon layer so that there is almost no the diffusion of aluminum in to the poly-crystalline silicon. Accordingly, when the semiconductor devices formed by the method (iii) are subjected to the heating cycle, a thermal stress is applied to the aluminum layer, so that the aluminum layer peels off the poly-crystalline silicon layer due to the poor contact force. In an extreme case, a wiring of the aluminum layer is broken.

The present invention will be described hereinafter, in which a term "non-doped semiconductor layer or region" is defined as a semiconductor layer or region into which impurities are not intentionally doped. Similarly, a term "a non-doped poly-crystalline silicon layer" means a poly-crystalline silicon layer into which impurities are not intentionally doped. That is, no impurity is doped into them by the diffusion method, the ion implantation or the like. However, the non-doped semiconductor and poly-crystalline silicon layer or region include ones doped with impurities which exist in ambient atmosphere or which exist on the object on which they are formed.

SUMMARY OF THE INVENTION

A major object of the present invention is to provide a semiconductor device and a method of producing the same in which an intimate contact between a semiconductor region and a conductive layer is greatly improved.

Another object of the present invention is to provide a semiconductor device and a method of manufacturing the same, which device has an electrode contact structure on a shallow PN junction suitable for a large scale integrated circuit.

Still another object of the invention is to provide a semiconductor device with structures for wiring electrodes. The electrodes are used on semiconductor regions having different conductivity types and are formed in the same semiconductor substrate. The electrode structures have excellent adhesion to the semiconductor regions and to the insulator covering the semiconductor substrate. The structures are free from the destruction of PN junctions. Another object of the invention is to provide a method of manufacturing the described device.

According to the present invention, a semiconductor device has a first semiconductor layer with a main surface. A second semiconductor layer forms a PN junction with the first semiconductor layer, the PN junction reaching the main surface. An insulating layer is formed on the main surface and has at least one window which at least exposes a part of the second semiconductor layer. A third semiconductor layer is formed on a portion which is exposed in the window and which has the same conductivity type as the second semiconductor layer. A metal-semiconductor alloy layer is electrically connected to the third semiconductor layer.

According to a modification of the present invention, a semiconductor device, of the above structure, has a metal-semiconductor alloy layer which contacts the third semiconductor layer, through a poly-crystalline semiconductor layer, in which impurities are doped.

According to another aspect of the invention, a method of manufacturing a semiconductor device comprises the steps of providing a first semiconductor layer with a main surface; making a second semiconductor layer which forms a PN junction reaching the main surface of the first semiconductor layer; forming an insulating layer with at least one window exposing at least a part of the second semiconductor layer on the main surface; forming a third semiconductor layer by introducing through the window impurities of conductivity type which is the same as the conductivity of the second semiconductor layer; forming a non-doped semiconductor layer covering the third semiconductor layer; forming a metal layer on the non-doped semiconductor layer; and forming a metal-semiconductor alloy layer of the non-doped semiconductor layer and the metal layer, to make electrical contact with the third semiconductor layer responsive to a heat treatment.

According to a modification of the manufacturing method, the step of forming the third semiconductor layer is performed by forming a poly-crystalline semiconductor layer on the second semiconductor portion exposed through the window. Thereafter the impurity is doped through the poly-crystalline semiconductor layer. The step of forming the non-doped semiconductor layer is performed by forming the non-doped semiconductor layer to cover the window through the poly-crystalline semiconductor layer.

The semiconductor device according to the present invention, therefore, has the insulating layer with the window for exposing at least a part of the second semiconductor region forming a PN junction. The third semiconductor layer has the same conductivity type as the second semiconductor layer has and is formed in the portion exposed through the window. The metal-semiconductor alloy layer provides an electrical contact with the third semiconductor layer.

Accordingly, since the second and third semiconductor layer are made of the same conductivity type, the metal-semiconductor alloy layer is electrically connected with the second semiconductor layer. Moreover, the third semiconductor layer is formed in the portion exposed through the window of the insulating layer. The window of the insulating layer exposes at least a part of the second semiconductor layer. Therefore, even when the window of the insulating layer exposes a part of the first semiconductor layer as the result of a structure design made by neglecting an allowance for the mask alignment, the portion exposed by the window and the second semiconductor layer have the same conductivity type because of the presence of the third semiconductor layer. Consequently, the metal-semiconductor alloy does not shortcircuit the PN junction between the first and second semiconductor layers. This enables the structure designer of the semiconductor device to neglect the allowance for the mask alignment, so that the integration density of semiconductor elements is greatly increased.

Furthermore, the material for the electrode and/or the interconnecting wiring is not a pure metal but is an alloy of the metal, and the semiconductor. Therefore, a mutual diffusion between the metal and the semiconductor caused by the heat treatment may not occur, so that the destruction of the PN junction is prevented. Consequently, the shallow PN junction may be formed with an improved manufacturing yield of the semiconductor device.

In the modification of the semiconductor device, according to the present invention, the metal-semiconductor alloy layer contacts a third semiconductor layer through the poly-crystalline semiconductor doped with the impurity. Also in this case, the integration density is increased and the performance is improved for the above reason. Moreover, the wiring material formed on the poly-crystalline semiconductor layer is not pure metal, but is an alloy layer of the metal and the semiconductor. Accordingly, the wiring material contains the same semiconductor material as the poly-crystalline semiconductor layer, so that the adhesion between the alloy wiring material and the poly-crystalline semiconductor layer is remarkably excellent, as compared to the adhesion between the pure metal and the poly-crystalline semiconductor layer. Therefore, a thermal stress applied to the metal-semiconductor alloy layer, when it is subjected to a heating cycle, is considerably reduced, resulting in preventing the alloy layer formed being broken down.

The effects attained by the semiconductor device, according to the present invention, will be better understood from considering its manufacturing method. After making the second semiconductor layer which forms the PN junction with the first semiconductor layer, the insulating layer with the window is formed for at least exposing a part of the second semiconductor layer. Thereafter, the third semiconductor layer is formed in the portion exposed through the window. The third layer is formed by doping impurities having a conductivity which is the same as the conductivity of the second semiconductor layer, through the window of the insulating layer. Therefore, even if the PN junction formed by the first and second semiconductor layers is exposed through the window, because the manufacturing design neglects the allowance for the mask alignment, the exposed portion is converted into the third semiconductor layer which has a conductivity which is the same conductivity type as the second semiconductor layer, as the result of doping the impurity through the window. Consequently, the PN junction with the first semiconductor layer is completely covered by the insulating layer. Therefore, there may be no necessity of considering the allowance for the masking alignment, so that an increase of integration density is achieved.

Moreover, according to a manufacturing method of the present invention, following the formation of the third semiconductor layer, the non-doped semiconductor layer and the metal layer are sequentially formed to cover the window. Thereafter, the metal-semiconductor alloy is formed by reacting them by heat treatment. As mentioned hereinbefore, there is very little diffusion of the metal layer into the impurity doped poly-crystalline semiconductor layer. However, according to the invention, the semiconductor layer is a non-doped one, and therefore, there is a reliable mutual diffusion between the metal and semiconductor alloy. In addition, since the metal layer has no contact with the third semiconductor layer, there is little mutual diffusion between the third semiconductor layer and the metal layer. The supply of the semiconductor material to the metal layer is performed from the non-doped semiconductor layer. Consequently, the PN junction is protected from its destruction by the alloy spike. Thus, the formation of electrode wiring is carried out for the semiconductor region having the shallow PN junction. This feature greatly contributes to the improvement of the performances of the semiconductor device.

In a modification of the manufacturing method of the present invention, the step of forming the third semiconductor layer is performed by forming the poly-crystalline semiconductor layer on the portion exposed through the window of the insulating layer and by doping the impurity through the poly-crystalline semiconductor layer. The non-doped semiconductor layer is formed to cover the window through the poly-crystalline semiconductor layer. Since the poly-crystalline semiconductor layer and the non-doped semiconductor layer are of the same semiconductor material, the adhesion between them is excellent. The metal layer is formed on the non-doped semiconductor layer, and then, they are made react to form the metal-semiconductor alloy layer. Since the metal-semiconductor alloy layer is an alloy layer of the metal layer and the non-doped semiconductor layer having a strong adhesion to the poly-crystalline semiconductor layer, it is a natural consequence that the metal-semiconductor alloy layer has also a strong adhesion to the poly-crystalline semiconductor layer. Therefore, the thermal stress to the metal-semiconductor alloy layer, due to the heating cycle, is greatly reduced with a result of preventing the metal-semiconductor alloy layer from the breakdown.

BRIEF DESCRIPTION OF THE DRAWINGS

Other objects, features and advantages of the present invention will be more apparent from the following description taken in connection with the accompanying drawings, in which.

DETAILED DESCRIPTION OF THE PREFERRED EMBODIMENTS

Figure 1:
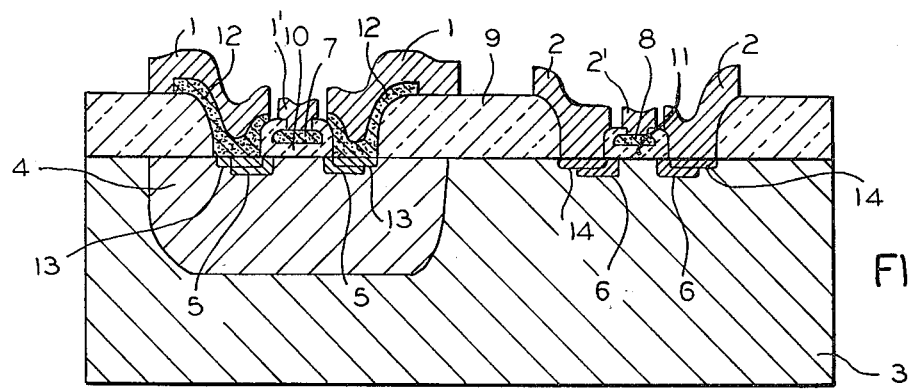
FIG. 1 is a cross sectional view of a complementary MOS semiconductor device according to one embodiment of the present invention.

FIG. 1 shows a complementary MOS semiconductor device according to one preferred embodiment of the present invention. More particularly, a P type impurity region 4 having an impurity concentration of approximately $10^{16}$ cm$^{-3}$, which is called a P-well, is formed in a N type silicon substrate 3 having an impurity concentration of approximately $10^{15}$ cm$^{-3}$. Source and drain regions 5 of N type are formed at a depth of 0.3 μm to 0.8 μm in the P-well 4 and source and drain regions of P type are formed at the same depth the substrate 3. A silicon dioxide layer 9, with thickness of about 0.5 μm, is placed on the substrate 3.

The silicon oxide layer 9 has contact windows for providing interconnecting layers. Area parts are exposed by contact windows for providing interconnecting layers to be connected to the N type impurity regions 5. That is source and drain regions 5 of a N-channel transistor are formed of N type impurity layers 13, having a semiconductor layer doped with N type impurity (i.e., a doped semiconductor layer is formed as a poly-crystalline silicon layer 12 of 0.5 μm to 0.8 μm thickness).

A P type impurity layer 14 is formed in area parts exposed by contact windows for connecting interconnecting layers to the P type impurity regions 6, that is, source and drain regions of an P-channel transistor. Aluminum-silicon alloy layers 1 and 2 result from a reaction of an aluminum layer and a non-doped polycrystalline silicon layer. These layers are respectively formed on the doped polycrystalline silicon layer 12 and the P type impurity layer 14.

A gate silicon dioxide layer 10 is formed on the P-well 4 between the N type source and drain regions 5. On the substrate 3 between P type source and drain regions 6 is formed a gate silicon dioxide layer 11. Silicon gate electrodes 7 and 8 are respectively formed on gate silicon dioxide layers 10 and 11. To silicon gate electrodes 7 and 8, are connected the aluminum-silicon alloy layers 1 and 2, respectively.

Figure 2:
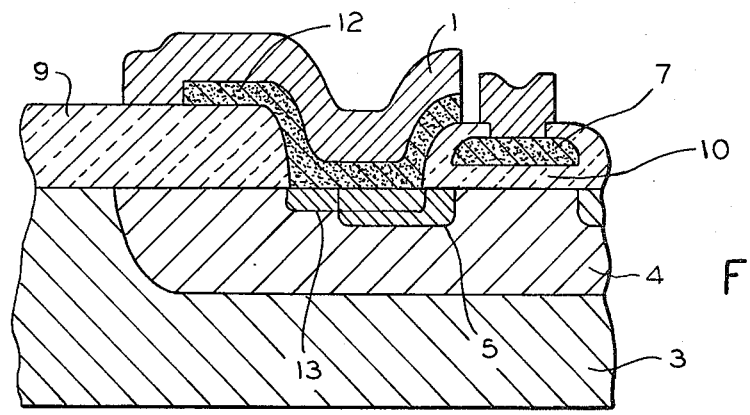
FIG. 2 is an enlarged cross sectional view showing a part of the semiconductor device shown in FIG. 1.
Figure 3:
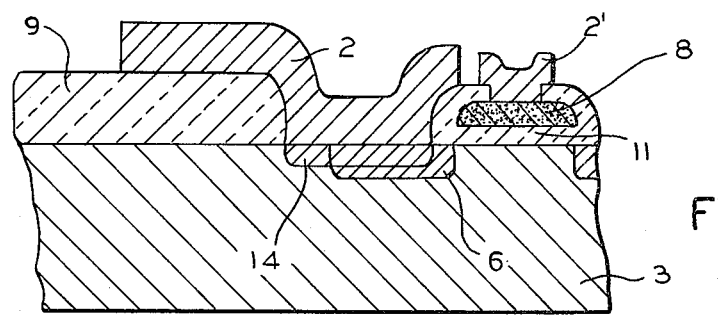
FIG. 3 is an enlarged cross sectional view showing another portion of the semiconductor device shown in FIG. 1.

Enlarged cross sectional views of the contact parts of interconnecting layers for N and P type source and drain regions 5 and 6 are shown in FIGS. 2 and 3, respectively. As apparent from FIGS. 2 and 3, N type impurity regions 5 and 13 are connected to the doped poly-crystalline layer 12. Similarly, P type impurity regions 6 and 14 are connected to the aluminum-silicon layers 2. Accordingly, there is hardly any the diffusion of an interconnecting material to those impurity regions, so that there is no destruction of the shallow PN junction. Moreover, the interconnecting layers are aluminum-silicon layers 1 and 2. That is, they contain silicon by which the respective regions 5, 6, 14 and 13 and the layer 12 are made. Accordingly, the aluminum-silicon layers 1 and 2 have a strong adhesion to the doped poly-crystalline silicon layer 12 and the P type impurity regions 6 and 14, respectively.

Figure 4A:
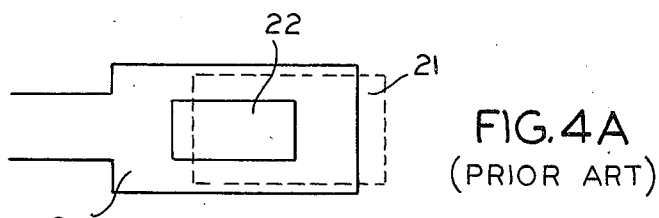
FIGS. 4A and 4B are respectively a plan view and a cross sectional view showing a portion in a semiconductor device formed by the prior art, which corresponds to the portion shown in FIG. 2.
Figure 4B:
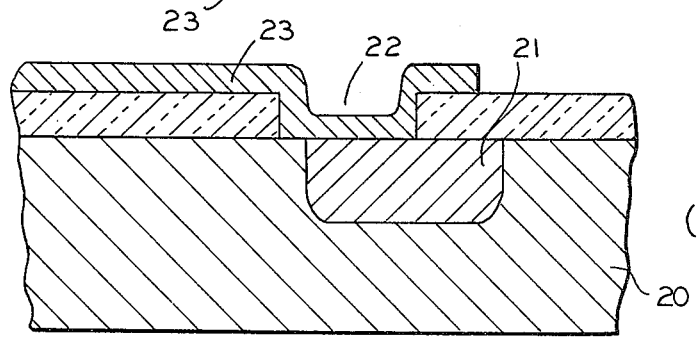

As well shown in FIGS. 4A and 4B, which illustrate the part plan and cross section views of a semiconductor device manufactured by the prior art, when a contact hole 22 is not aligned with a diffusion layer 21 formed in a substrate 20, an aluminum-silicon alloy layer 23 shorcircuits the PN junction. This defect may be avoided by forming the diffusion layer 21 with such a large size that it covers the mask misalignment. This formation, however, cannot increase an integration density of the circuit. On the contrary, as shown in FIGS. 2 and 3, according to the present invention, even if the contact windows are not aligned with the impurity regions 5 and 6, the N and P type impurity regions 13 and 14 are formed in the portions exposed by the contact windows, so that the above described shortcircuit accident is avoided, and good PN junctions are provided.

Figure 5:
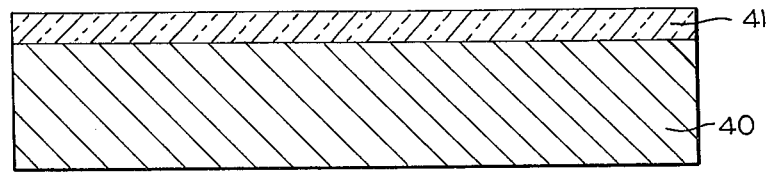
FIGS. 5 to 21 are cross sectional views illustrating a sequence of process steps for manufacturing a complementary MOS semiconductor device according to a preferred embodiment of the present invention.

An embodiment of a manufacturing method of a complementary MOS semiconductor device, according to the present invention, will be described with reference to FIGS. 5 to 18. First, according to the conventional manufacturing method, a silicon dioxide layer 41 is formed with a thickness of approximately 1000 Å, as shown in FIG. 5, on the surface of an N type silicon substrate layer 40 with an impurity concentration of about $10^{15}$ cm$^{-3}$. The layer is formed by a thermal oxidation process, at 1000° C. in a saturated steam.

Figure 6:
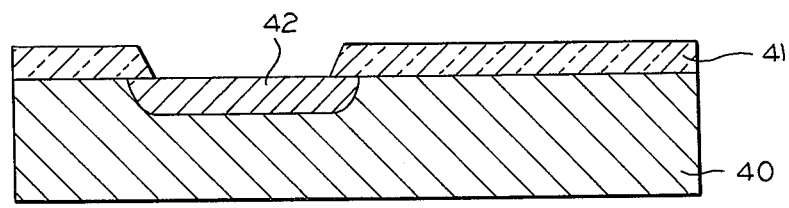

Next, a portion of the silicon dioxide layer 41, where the P-well 42 (FIG. 6) is to be formed, is selectively etched away by the photoetching method. Then, boron is deposited on and diffused in the substrate 40 by either the thermal diffusion process or the ion implantation process, and thus the P-well 42 is formed as shown in FIG. 6.

Figure 7:
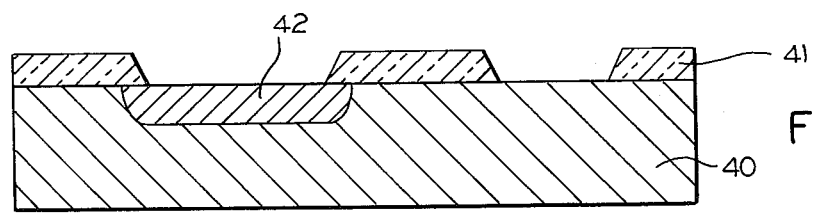
Figure 8:
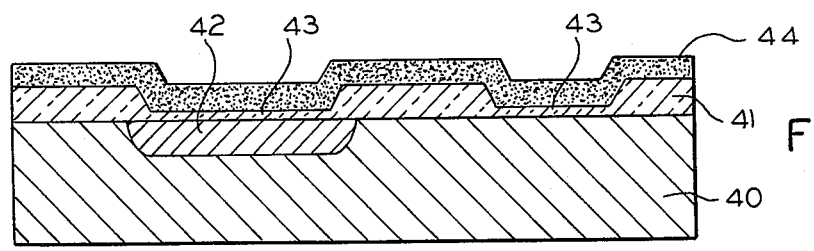

The next step is to selectively photoetch portions of the silicon dioxide layer 41 where N and P channel transistors are formed, as shown in FIG. 7. Then, a gate oxide film 43 (FIG. 8) with a thickness of 400 to 700 Å is formed by the thermal oxidation process, at 900° C. as shown in FIG. 8. Thereafter, a poly-crystalline silicon layer 44, without an impurity (a non-doped poly-crystalline silicon layer), is grown to a thickness of 5000 to 8000 Å by the vapor deposition process of thermal decomposition of silane, for example, at 700° C. The poly-crystalline silicon layer 44 may be replaced by an amorphous silicon layer.

Figure 9:
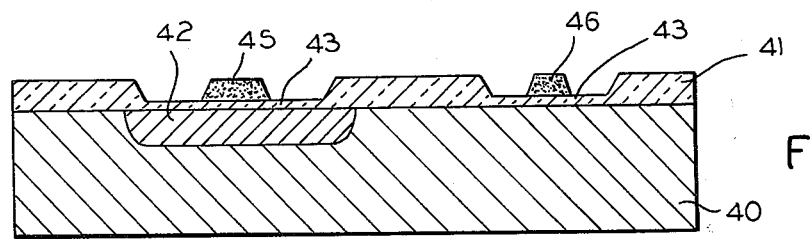

In a step shown in FIG. 9, the non-doped poly-crystalline silicon layer 44 is selectively etched away by a photoetching method, to leave necessary portions of layer 44 (in the drawing, these are gate portions 45 and 46 of each transistor).

Figure 10:
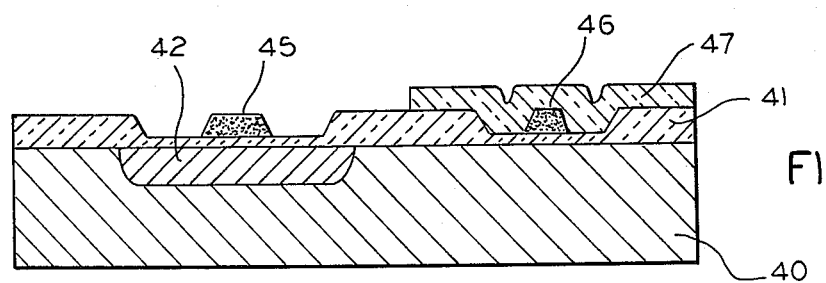

After this step, a silicon nitride film 47 (FIG. 10) is formed with a thickness of approximately 0.5 μm over the entire surface by the CVD (chemical vapor deposition) method, e.g. the method in which silane and ammonia are made to react at 700° C. The silicon nitride film 47 should be thick enough to serve as a mask for forming source and drain regions of the N channel transistor. Then, as shown in FIG. 10, portions of the silicon nitride film 47 are selectively etched away by the photoetching technique. The etched portions include the portions where there are N type impurity regions such as source and drain region of the N channel transistor. Thereafter, in order to form source and drain regions of the N channel transistor, the silicon oxide layer 43 layered thereon is removed by a self-alignment method as an etching mask of the poly-crystalline silicon layer 45.

Figure 11:
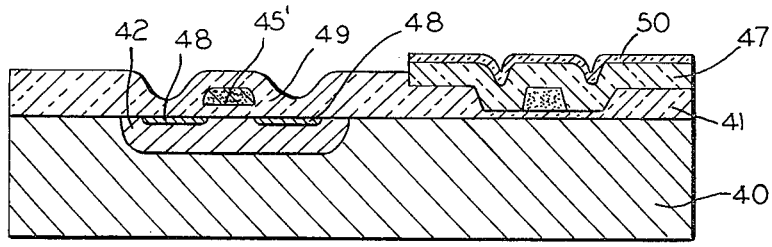

Then, as shown in FIG. 11, arsenic is implanted into the exposed parts of P-well 42 by the ion implantation method, to form N type source and drain regions 48, with a depth of 0.4 to 1.0 μm and an impurity concentration $10^{21}$ cm$^{-3}$. In this step, arsenic is also implanted into the gate poly-crystalline silicon layer 45 to form an arsenic doped layer 45', serving as a gate electrode.

In the method of forming the source and drain regions 48, the ion implantation method is superior to the diffusion method. In the case of the diffusion method, the N type impurity of arsenic is diffused from the end portion of the silicon oxide film 43 and into the inside of the P well 42. At the same time, the N type impurity is also diffused laterally. As a result, a distance between the source and drain, (i.e. a channel length) is undesirably too short, so that a punch-through voltage is too low. On the other hand, in the case of the ion implantation method, the impurity is doped substantially vertically from the end portion of the silicon oxide layer 43, into the P-well 42. Therefore, the punch-through voltage is prevented from being reduced. In addition, the most suitable impurity is arsenic, because the diffusion coefficient of the arsenic is small, and therefore a shallow PN junction is reliably and easily realized. For example, if phosphor were to be used as a doped impurity, its diffusion coefficient is relatively large, so that it would be improper for forming the shallow PN junction.

Subsequently, the N type source and drain regions 48 and the N type impurity doped poly-crystalline silicon gate 45' are coated with a silicon oxide film 49, formed by the thermal oxidation. As a result of the thermal oxidation, an oxide film 50 is also formed on the silicon nitride film 47.

Figure 12:
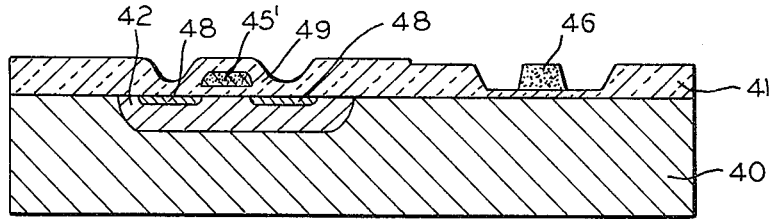

After this step, the silicon oxide film 50 and the silicon nitride film 47, coated over the P type impurity regions, are etched away by the plasma etchant of $CF_4$, as shown in FIG. 12.

Figure 13:
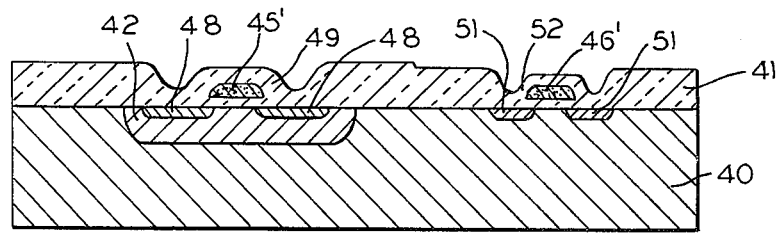

Next, the silicon oxide film 43 is selectively removed (FIG. 13) for forming the P type impurity regions for the source and the drain of the P channel transistor by the self alignment process. Then, boron ions are implanted into the exposed portions of N type substrate 40 to form source and drain regions 51, having the shallow PN junction and a desirable channel length. By this step, the source and drain regions 51 are formed with a depth of 0.4 to 1 $\mu$m and an impurity concentration of $10^{21}$ cm$^{-3}$, as shown in FIG. 13. At this time, the P type impurity is also implanted into the poly-crystalline silicon layer 46 on the N type impurity substrate 40 to form P type impurity doped silicon gates 46', serving as a gate electrode, as also shown in FIG. 13. After this, P type source and drain regions 51 and the P type silicon gate 46', containing an impurity, are coated with a silicon oxide film 52 formed by the thermal oxidation.

Figure 14:
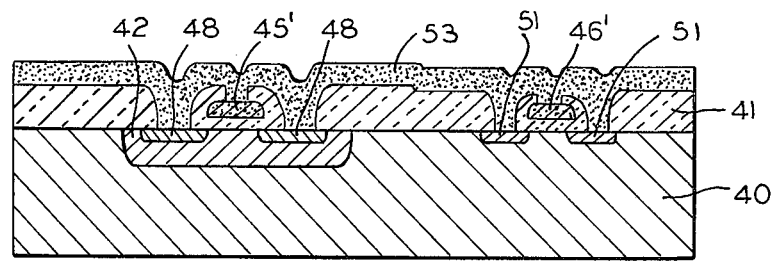
Figure 15:
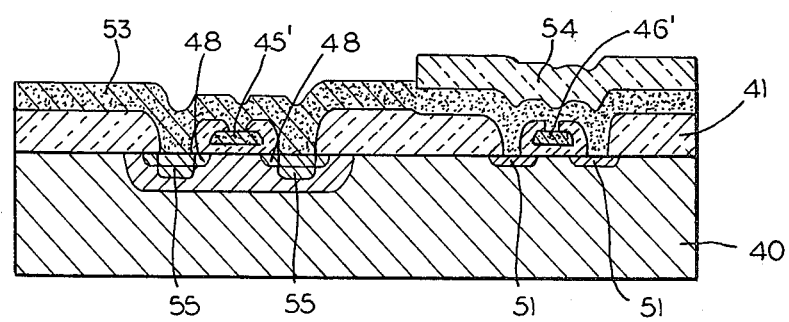

Next, contact windows are formed at predetermined locations in the silicon oxide films 49 and 52. Thereafter, the entire surface is coated with a non-doped poly-crystalline silicon layer 53 with a thickness 5000 Å to 8000 Å, as shown in FIG. 14. Afterward, in order to compensate for any misalignment of the contact window, an N type impurity of phosphorus is doped, by the thermal diffusion method, into the poly-crystalline silicon layer 53 on the N type impurity region 48, as shown in FIG. 15. This step is performed after a nitride film 54, having enough thickness to serve as a mask against N type impurity, was formed on the poly-crystalline silicon layer 53 on the P type impurity regions 51. By that nitride film forming step, the N type impurities penetrate the poly-crystalline silicon layer 53 and are doped into the P well 4, through the contact windows.

Consequently, the N type regions 55 are necessarily formed under the contact windows. Therefore, even if the contact windows are dislocated from the predetermined positions of the N type diffusion layer 48, there is a great advantage because a wiring layer which is to be formed never makes a shortcircuit between the N type diffusion layer 48 and the P-well 42. The poly-crystalline silicon layer 53 is converted into an N type poly-crystalline silicon layer 53' doped with phosphorus, by the above diffusion step. Furthermore, the phosphorus doped in the P-well 42 through the poly-crystalline silicon layer 53 has a larger diffusion coefficient than the arsenic in the N type source and drain regions 48. Thus, the N type regions 55 formed by a drive-in process become deeper than the source and drain regions 48.

Figure 16:
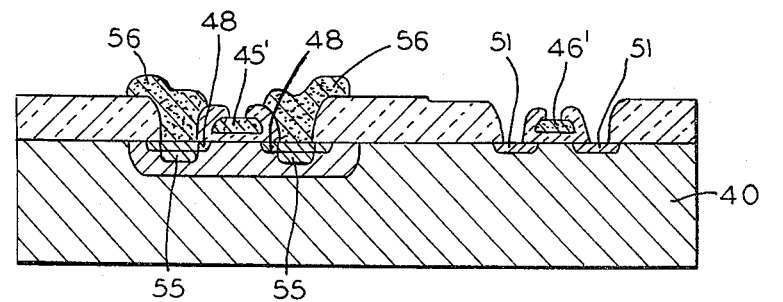

Subsequently, the silicon nitride film 54 and the poly-crystalline silicon layer 53 are etched away. The doped poly-crystalline silicon layer 53' is selectively removed to make electrodes and/or interconnecting layers for the N type source and drain 48, as shown in FIG. 16.

Figure 17:
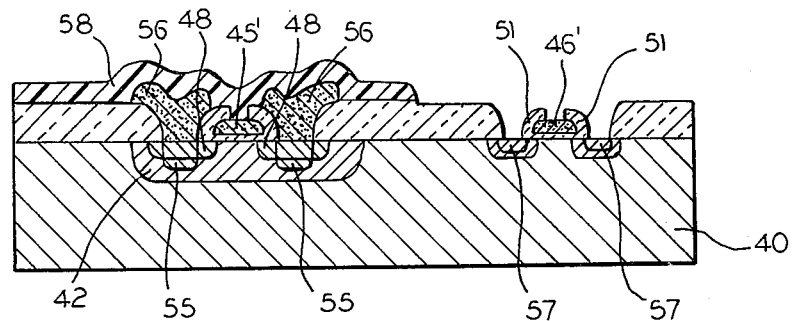

Then, as shown in FIG. 17, a P type impurity, such as boron ion (B+), is implanted into the N type substrate 40 with an acceleration energy of 50 KeV and a dose amount of about $10^{13}$ cm$^{-2}$, to form a P type regions 57, as shown in FIG. 17. The ion implantation is performed by setting a mask such as photoresist 58 for protection of the ion implantation to the P well 42. Therefore, even if the contact windows are misaligned from the predetermined positions of the P type source and drain regions 51, the P type layer 51 and the substrate 40 are never shortcircuited by the wiring layer which is to be formed later. Since the P type layers 51 and 57 are formed by the same impurity, i.e. boron, the layer 57 is shallower than the layer 51.

Figure 18:
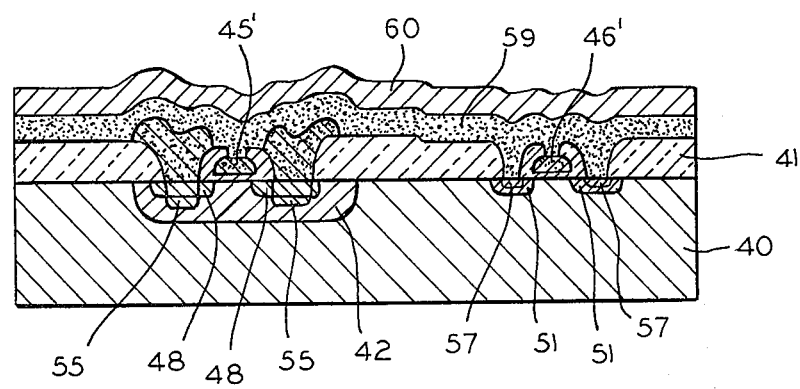

After this, the photoresist layer 58 is removed, and then, as shown in FIG. 18, the entire surface is coated with a non-doped poly-crystalline silicon layer 59, with thickness of 500 Å to 3000 Å, by the vapor deposition method of thermal decomposition of silane at 700° C. Following this step, an aluminum layer 60 of about 1 $\mu$m is deposited on the non-doped poly-crystalline silicon layer 59 by the vacuum evaporation process.

Figure 19:
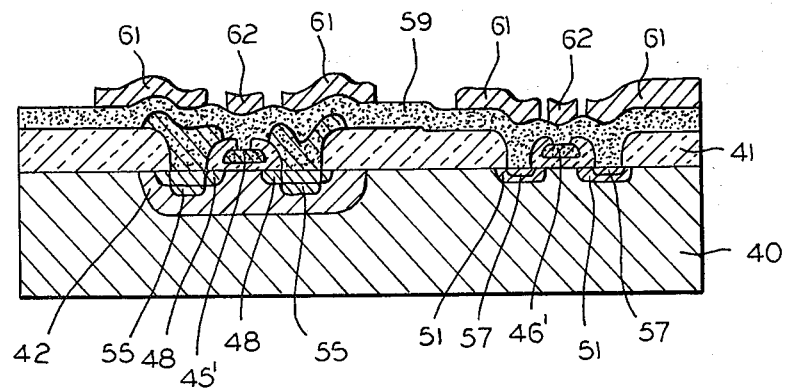
Figure 20:
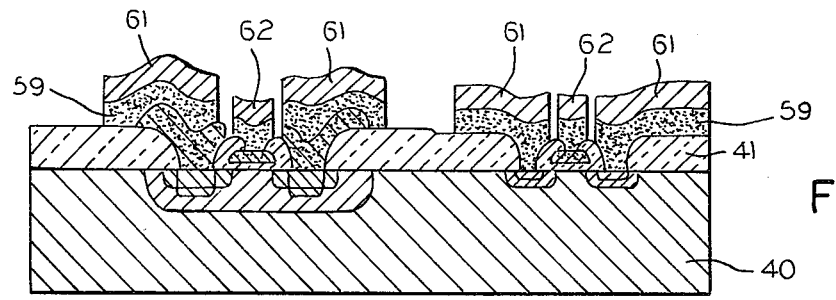
Figure 21:
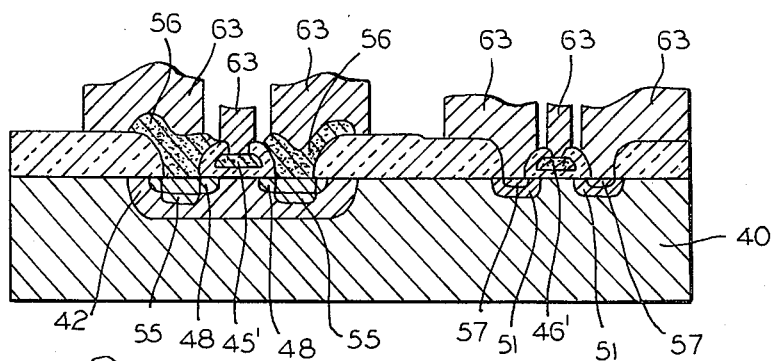

Thereafter, as shown in FIG. 19, the aluminum layer 60 is selectively removed by the dry etching technique to form predetermined wiring patterns made of aluminum layers 61 and 62. Then, the non-doped poly-crystalline silicon layer 59 is selectively removed by using the aluminum layers 61 and 62 as a mask against the etchant of the silicon layer 59, as shown in FIG. 20. Next, performing the heat treatment in order to react the aluminum layers 61 and 62 with the non-doped poly-crystalline silicon layer 59, aluminum-silicon alloy layers 63 (FIG. 21) are formed.

Through the sequence of the process steps as mentioned above, the complementary MOS semiconductor device is formed.

According to the above described manufacturing method, even if the source and drain regions 48 and 51 of the respective transistors are formed without any margin for error of the mask alignment, there is an increase of the integration density, and there never is any shortcircuiting at the PN junction due to the alloy layers 63. This is because the impurities are doped in the P-well 42 and the substrate 40, after the contact windows are formed.

In addition, the present embodiment further has the following advantages. More particularly, as fine patterns of element dimensions according to the increases of integration density, the reactive dry etching technique (e.g. plasma etching) is preferable in the step of forming or patterning the wiring layers. In this step, according to prior art, when contact windows are not aligned with patterning masks for wiring layers, a part of a semiconductor substrate in contact windows is exposed by the removal of a metal layer deposited on that part, so that of the substrate is damaged by an etchant of the reactive etching.

As a result, lattice defects are generated in the crystal lattice of the semiconductor substrate, so that the leakage current at the PN junction is increased by the lattice defects. On the other hand, in the above method, the non-doped poly-crystalline silicon layer 59 (FIG. 18) lies under the aluminum layer 60 during the patterning of the aluminum layers 61 (FIG. 19) and 62. Therefore, even when the contact windows are not aligned with the patterning masks for the aluminum layers 61 and 62, any damage by the reactive dry etching is supplied not to the silicon substrate 40 but to the non-doped poly-crystalline silicon layer 59. Consequently, the present method brings about no increase of the junction leakage, and therefore, a good PN junction is ensured.

Another useful effect of the present embodiment originates from the steps of sequentially forming the non-doped poly-crystalline silicon layer 59 and the aluminum layer 60 on the doped poly-crystalline silicon layer 56, and reacting the aluminum layer 60 with non-doped poly-crystalline silicon layer 59. More particularly, the method according to prior art is to diffuse the impurity doped in the poly-crystalline silicon layer into the mono-crystalline silicon layer, and thereafter, to deposit aluminum on the doped poly-crystalline silicon layer, as described hereinbefore. However, the adhesive force between them in this case is poor. This is because the impurity is being diffused in the poly-crystalline silicon layer to a degree of the solid solubility limitation at a high temperature. The mutual diffusion between the silicon layer and the aluminum layer is hardly performed by this prior art. Under the condition of the poor adhesive contact, the thermal stress arising from the heating cycle causes the aluminum layer to be broken down.

According to the above embodiment, the non-doped poly-crystalline silicon layer 59 is inserted between the poly-crystalline silicon layer 56 doped with the impurity and the aluminum layers 61 and 62. The impurity doped poly-crystalline silicon layer 56 and the non-doped poly-crystalline silicon layer 59 intimately contact each other, because they are made of the same semiconductor material. Since the non-doped poly-crystalline silicon layer 59 does not include the impurity, the mutual diffusion between the aluminum layers 61 and 62 and the non-doped poly-crystalline silicon layer 59 is surely performed by the heat treatment. Consequently, the intimate contact between the impurity doped poly-crystalline silicon layer 56 and the alloy layer 63 is increased, thus preventing the breakdown of the alloy wiring layer 63.

Figure 22A:
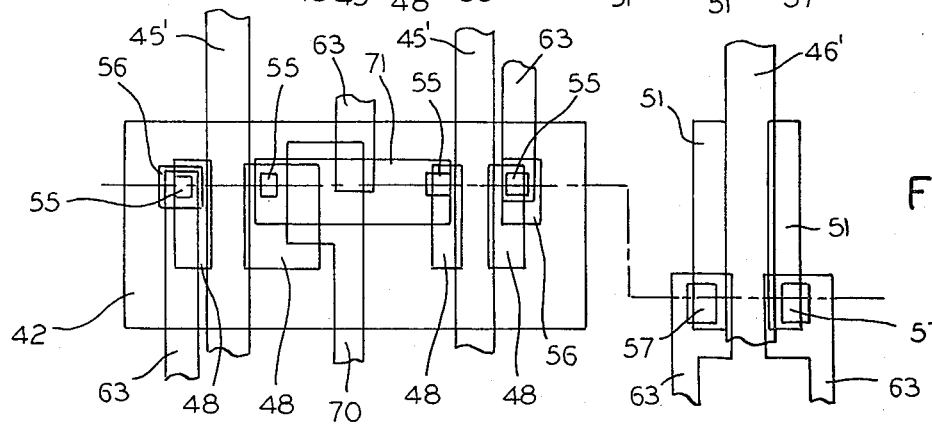
FIGS. 22A and 22B are respectively a plan view and a cross sectional view of a complementary MOS semiconductor device according to another embodiment of the present invention.
Figure 22B:
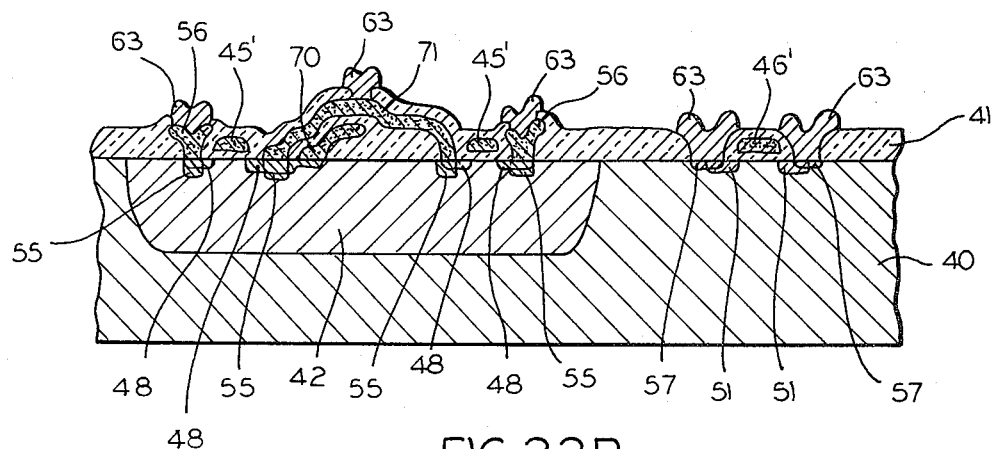

FIGS. 22A and 22B show a plan view and a cross sectional view of a part of the a complementary MOS semiconductor device, according to another embodiment of the present invention. The present embodiment is featured by having interconnecting layers formed by the doped poly-crystalline silicon layer, by taking advantage of the steps of forming the silicon gates 45' and 46' and the doped poly-crystalline silicon layer 56.

The description of the present embodiment will be given corresponding to the steps of the above embodiment. The same references are used for designating the same portions as in the above embodiments and the explanation of those portions will be omitted. A doped poly-crystalline silicon layer 70 make contact with the drain region 48 of the N channel transistor. The layer 70 is formed at first as a non-doped poly-crystalline silicon layer, simultaneously with the forming of the poly-crystalline silicon layers 45 and 46 shown in FIG. 9. The layer 70 is formed with a predetermined wiring pattern, to be connected to another region or other regions (not shown). Furthermore, the poly-crystalline silicon layer 70 overlaps with the silicon oxide layer 41.

Then, in the step of FIG. 11, the arsenic is used as an impurity for forming the source and drain regions 48 and is also doped into the poly-crystalline silicon layer. The doped poly-crystalline silicon layer 70 (FIGS. 22A, 22B) is formed as the first wiring layer connected to another region or other regions. Since the impurity doped into the layer 70 also reaches the P well 42, the drain region 48 has a stepwise junction, as shown in FIG. 22B. A doped poly-crystalline silicon layer 71 connects the N type drain region 48 of the left side transistor to the N type source region 48 of the right side transistor. Layer 71 is selectively etched at the same time that the doped poly-crystalline silicon layer 53' is selectively etched in the step of FIG. 16. Thus, connection between the drain and source regions of two transistors by doped poly-crystalline silicon layer 71 is carried out. This layer 71 is used as the second wiring layer. The third wiring layer is the aluminum-silicon alloy layer 63.

It should be noted that the poly-crystal silicon layers 70 and 71 which are used as the wiring layers are all of the N type. This conductivity type is selected from the viewpoint of the operation speed of the semiconductor device. That is, the mobility of electron which represents the N conductivity is faster than the mobility of the hole. Therefore, the N type poly-crystalline silicon layer is preferable to the P type conductivity, for the interconnecting layer.

As described above, the complementary MOS semiconductor device shown in FIGS. 22A and 22B employs three wiring layers, and those wiring layers may be formed by a use of the methods described in the above embodiment with only the change of mask patterns. Therefore, the device has a high density multilayer wiring without any increase of the manufacturing steps. The integration density of the circuit elements is further increased.

As seen from the foregoing, the present invention provides a semiconductor device and a method of manufacturing the same by a formation of electrodes and/or wiring layers for the shallow PN junction. The distances between the adjacent elements or the adjacent regions may be shortened.

It is noted that the thickness and concentration of the semiconductor regions, the thickness and material of the insulating layers, and the impurity and the metal material shown in the above embodiments are not critical, but may be changed as required. Moreover, the ion implantation method, for forming the source and drain regions may be replaced by the diffusion method. Still further, though the present invention has been described by an example of the complementary MOS transistor, the present invention is applicable for any other types of semiconductor devices. For example, the silicon gate may be replaced by a metal gate, such as aluminum, as the gate electrode of MOS transistor.

What is claimed is:

1. A method of manufacturing a semiconductor device comprising the steps of providing a semiconductor layer with a main surface, forming a first semiconductor region making a PN junction with said semiconductor layer, said PN junction reaching said main surface, forming an insulating layer having a hole for exposing at least a part of said first semiconductor region on said main surface, introducing impurities having the same conductivity type as said first semiconductor region in said semiconductor layer through said hole of said insulating layer to form a second semiconductor region having a depth which is shallower than the depth of said first semiconductor region, said second semiconductor region making contact with said first semiconductor region, and forming a metal-semiconductor alloy layer electrically connected to said second semiconductor region.

2. A method of manufacturing a semiconductor device comprising the steps of introducing first impurities representing one conductivity type into a semiconductor layer of the opposite conductivity type to form a first semiconductor region making a P-N junction with said semiconductor layer, covering the surface of said first semiconductor region with an insulating layer having a hole for exposing a portion of the surface of said first semiconductor region, depositing a poly-crystalline semiconductor layer in said hole of said insulating layer, introducing second impurities representing said one conductivity type and having a diffusion coefficient larger than the diffusion coefficient of said first impurities, said second impurities being introduced into said exposed portion through said poly-crystalline semiconductor layer to form a second semiconductor region of one conductivity type making contact with said first semiconductor region, depositing a non-doped semiconductor layer on said poly-crystalline semiconductor layer, depositing a metal layer on said non-doped semiconductor layer, and performing a heat treatment to produce a metal-semiconductor alloy layer of said non-doped semiconductor layer and said metal layer.

3. The method of manufacturing a semiconductor device as claimed in claim 2, wherein said first and second impurities are arsenic and phosphorous, respectively, and said poly-crystalline and non-doped semiconductor layers are made of silicoin, and said metal layer is made of aluminum.

4. A method of producing a field effect transistor comprising the steps of forming source and drain regions of one conductivity type in a semiconductor layer of the opposite conductivity type, forming a gate on said semiconductor layer through a gate insulating film for controlling an electrical path between said source and drain regions, covering the surface of said semiconductor layer with an insulative layer having a first hole exposing a portion of at least one of said source rgion and said drain region, introducing impurities representing said one conductivity type in said semiconductor layer through said first hole of said insulative layer to form a first semiconductor region of said one conductivity type having a depth which is shallower than the depth of said source and drain regions, said first semiconductor region making contact with said one of said source and drain regions, and forming a metal-semiconductor alloy layer on said first semiconductor region.

5. A method of manufacturing a complementary semiconductor device comprising the steps of forming a well region of a first conductivity type in a semiconductor substrate of a second conductivity type, forming a first gate on said well region and a second gate on said semiconductor substrate through a gate insulating film, respectively, introducing first impurities of said second conductivity type into said well region to form first drain and first source regions of said second conductivity type which cooperate with said first gate to constitute a first transistor of a first channel type, introducing second impurities of said first conductivity type into said semiconductor substrate to form second drain and second source regions of said first conductivity type which cooperate with said second gate to constitute a second transistor of a second channel type, forming an insulative layer over surfaces of said well region and said semiconductor substrate, forming first and second contact holes for at least one of said first drain and first source regions and for at least one of said second drain and second source regions, respectively, forming a poly-crystalline semiconductor layer in said first contact hole, introducing third impurities of said second conductivity type having a diffusion coefficient larger than the diffusion coefficient of said first impurities, said third impurities being introduced through said poly-crystalline semiconductor layer into said one of said first drain and source regions to form a first semiconductor region of said second conductivity type, introducing said second impurities into said semiconductor substrate through said second contact hole to form a second semiconductor region having a depth which is shallower than the depth of said second drain and second source regions and making contact with said one of said second drain and second source regions, and forming metal-semiconductor alloy layers on said poly-crystalline semiconductor layer and in said second contact hole of said insulative layer to serve as electrodes for said at least one of said first drain and first source regions and for said at least one of said second drain and second source regions, respectively.

6. The method of manufacturing a complementary semiconductor device as claimed in claim 5, wherein said first, second and third impurities are arsenic, boron and phosphorus, respectively, said first and second impurities being introduced into said well region and said semiconductor substrate by an ion implantation of arsenic and boron ions, respectively, and said third impurities being introduced in said well region by diffusion of phosphorus impurities.

7. The method of manufacturing a complementary semiconductor device as claimed in claim 5, wherein said poly-crystalline semiconductor layer is elongated on said insulative layer to serve as an interconnection layer, said interconnection layer being doped with said third impurities.

8. A method of manufacturing a complementary semiconductor device comprising the steps of providing a semiconductor substrate of one conductivity type having a first zone in which a first transistor of a first channel type is formed and a second zone in which a second transistor of a second channel type is formed; forming a well region of the opposite conductivity type in said first zone of said semiconductor substrate; forming a first insulated gate of said first transistor on said well region and a second insulated gate of said second transistor on said second zone of said semiconductor substrate; introducing first impurities representing said one conductivity type into said well region by making use of said first insulated gate as a mask to form first drain and source regions of said first transistor; introducing second impurities representing said opposite conductivity type into said second zone of sais semiconductor substrate by making use of said second insulated gate as a mask to form second drain and source regions of said second transistor; covering said well region, said second zone of said semiconductor substrate, and said first and second insulated gates with an insulating layer having first, second, third and fourth contact holes provided for said first drain, first source, second drain, and second source regions, respectively; forming first and second poly-crystalline semiconductor layers covering said first and second contact holes of said insulating layer; masking said third and fourth contact holes of said insulating layer to introduce third impurities representing said one conductivity type and having a diffusion coefficient which is larger than the diffusion coefficient of said first impurities; introducing said third impurities into said well region through said first and second poly-crystalline semiconductor layers, said third impurities forming first and second semiconductor regions which are electrically connected to said first drain, and source rgions, respectively; said first and second poly-crystalline semiconductor layers being doped with said third impurities to serve as an interconnection layer; masking said first and second poly-crystalline layers to introduce fourth impurities which are the same as said second impurities into said second zone of said semiconductor substrate; introducing said fourth impurities through said third and fourth contact holes of said insulating layer, said fourth impurities forming third and fourth semiconductor regions which are electrically connected to said second drain and source regions, respectively, said third and fourth semiconductor regions having a depth which is shallower than the depth of said second source and drain regions; depositing a non-doped semiconductor layer covering said insulating film, said first and second poly-crystalline semiconductor layers, and said third and fourth contact holes; depositing a metal layer on said non-doped semiconductor layer; patterning said metal layer by reactive dry etching; patterning said non-doped semiconductor layer by making use of the patterned metal layer as a mask; and alloying the patterned metal layer with the patterned non-doped semiconductor layer to form metal-semiconductor alloy layers connecting to said first and second poly-crystalline semiconductor layers and covering said third and fourth contact holes, respectively, the thickness of said non-doped semiconductor layer being selected so that an etchant of said reactive dry etching does not damage said semiconductor substrate.

9. The method of manufacturing a complementary semiconductor device as claimed in claim 8, wherein said first and third impurities are arsenic and phosphorus, respectively, and said second and fourth impurities are boron, respectively.

10. The method of manufacuting a complementary semiconductor device as claimed in claim 8, wherein said first and second poly-crystalline semiconductor layers and said non-doped semiconductor layer are made of silicon, respectively, and said metal layer is made of aluminum.

11. The method of manufacturing a complementary semiconductor device as claimed in claim 8, wherein said first and second insulated gates are made of silicon, respectively, said first insulated gate being doped with said first impurities, said second insulated gate being doped with said second impurities.

12. The method of manufacturing a complementary semiconductor device as claimed in claim 8, wherein said first, second and fourth impurities are introduced by ion implantation of impurity ions, respectively, and said third impurities are introduced by diffusion.

13. The method of manufacturing a complementary semiconductor device as claimed in claim 8, wherein said thickness of said non-doped semiconductor layer is selected within a range of 500 A to 3000 A.

* * * * *